(12) United States Patent
Hsu et al.

(10) Patent No.: US 10,957,762 B2
(45) Date of Patent: Mar. 23, 2021

(54) MANUFACTURING METHOD OF SEMICONDUCTOR DEVICE INCLUDING CONDUCTIVE STRUCTURE

(71) Applicant: UNITED MICROELECTRONICS CORP., Hsin-Chu (TW)

(72) Inventors: Te-Chang Hsu, Tainan (TW); Che-Hsien Lin, Taoyuan (TW); Cheng-Yeh Huang, Tainan (TW); Chun-Jen Huang, Tainan (TW); Yu-Chih Su, Tainan (TW); Yao-Jhan Wang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/878,542

(22) Filed: May 19, 2020

(65) Prior Publication Data

US 2020/0279917 A1    Sep. 3, 2020

Related U.S. Application Data

(62) Division of application No. 16/194,379, filed on Nov. 18, 2018, now Pat. No. 10,700,163.

(30) Foreign Application Priority Data

Oct. 23, 2018    (CN) .......................... 201811235109.8

(51) Int. Cl.
*H01L 21/768*    (2006.01)
*H01L 29/78*    (2006.01)
(Continued)

(52) U.S. Cl.
CPC .... *H01L 29/0653* (2013.01); *H01L 21/31111* (2013.01); *H01L 21/32139* (2013.01);
(Continued)

(58) Field of Classification Search
CPC ............ H01L 23/5226; H01L 23/5283; H01L 23/53266; H01L 21/76802;
(Continued)

(56) References Cited

U.S. PATENT DOCUMENTS 6,107,189 A    8/2000 Wald
9,397,008 B1    7/2016 Tung
(Continued)

*Primary Examiner* — Matthew E Warren
(74) *Attorney, Agent, or Firm* — Winston Hsu

(57) ABSTRACT

A manufacturing method of a semiconductor device includes the following steps. A semiconductor substrate with gate structures formed thereon is provided. A source/drain region is formed in the semiconductor substrate and formed between the gate structures. A dielectric layer is formed on the source/drain region and located between the gate structures. An opening penetrating the dielectric layer on the source/drain region is formed. A lower portion of a first conductive structure is formed in the opening. A dielectric spacer is formed on the lower portion and on an inner wall of the opening. An upper portion of the first conductive structure is formed in the opening and on the lower portion. The dielectric spacer surrounds the upper portion of the first conductive structure. The first conductive structure is formed by two steps for forming the dielectric spacer surrounding the upper portion and improving the electrical performance of the semiconductor device.

9 Claims, 6 Drawing Sheets

(51) Int. Cl.
*H01L 23/522* (2006.01)
*H01L 23/528* (2006.01)
*H01L 23/532* (2006.01)
*H01L 29/06* (2006.01)
*H01L 29/417* (2006.01)
*H01L 29/66* (2006.01)
*H01L 21/3213* (2006.01)
*H01L 21/311* (2006.01)

(52) U.S. Cl.
CPC .. *H01L 21/76802* (2013.01); *H01L 21/76807* (2013.01); *H01L 21/76831* (2013.01); *H01L 21/76834* (2013.01); *H01L 21/76843* (2013.01); *H01L 21/76877* (2013.01); *H01L 21/76895* (2013.01); *H01L 23/5226* (2013.01); *H01L 23/5283* (2013.01); *H01L 23/53266* (2013.01); *H01L 29/41783* (2013.01); *H01L 29/66545* (2013.01); *H01L 29/66795* (2013.01); *H01L 29/785* (2013.01)

(58) Field of Classification Search
CPC ........... H01L 21/76831; H01L 21/6834; H01L 21/76843; H01L 21/76877
USPC ................................ 257/750, 751, 774, 775
See application file for complete search history.

(56) References Cited

U.S. PATENT DOCUMENTS

| | | |
|---|---|---|
| 9,449,921 B1 | 9/2016 | Basker |
| 2008/0230917 A1 | 9/2008 | Chou |
| 2016/0163586 A1 | 6/2016 | Siew |
| 2016/0358812 A1 | 12/2016 | Murray |
| 2019/0393318 A1* | 12/2019 | Chung .............. H01L 21/76831 |

* cited by examiner

MANUFACTURING METHOD OF SEMICONDUCTOR DEVICE INCLUDING CONDUCTIVE STRUCTURE

CROSS REFERENCE TO RELATED APPLICATIONS

This application is a division of application Ser. No. 16/194,379 filed on Nov. 18, 2018, now allowed, which is incorporated by reference herein in its entirety.

BACKGROUND OF THE INVENTION

1. Field of the Invention

The present invention relates to a semiconductor device and a manufacturing method thereof, and more particularly, to a semiconductor device including a dielectric spacer and a manufacturing method thereof.

2. Description of the Prior Art

The development of semiconductor integrated circuit technology progresses continuously and circuit designs in products of the new generation become smaller and more complicated than those of the former generation. The amount and the density of the functional devices in each chip region are increased constantly according to the requirements of innovated products, and the size of each device has to become smaller accordingly. For example, in field effect transistors, the spacing between gate lines becomes smaller for enhancing the integrity of the integrated circuit. The process window of forming conductive plugs between the gate lines and/or on the gate lines may be extremely small as the dimension of the gate line and the spacing between the gate lines become smaller and smaller, and the time dependent dielectric breakdown (TDDB) performance of dielectric material between the conductive plugs may be deteriorated. Accordingly, the electrical performance and the reliability will be influenced.

SUMMARY OF THE INVENTION

A semiconductor device and a manufacturing method thereof are provided in the present invention. A first conductive structure is formed by a two-step approach for forming a dielectric spacer on a lower portion of the first conductive structure and surrounding an upper portion of the first conductive structure. The distance between different conductive structures may be increased by the dielectric spacer, and the purpose of enhancing the electrical performance and the reliability of the semiconductor device may be achieved accordingly.

According to an embodiment of the present invention, a manufacturing method of a semiconductor device is provided. The manufacturing method includes the following steps. Firstly, a semiconductor substrate is provided. Gate structures are formed on the semiconductor substrate, a source/drain region is formed in the semiconductor substrate and formed between the gate structures, and a dielectric layer is formed on the source/drain region and located between the gate structures. An opening is formed penetrating the dielectric layer on the source/drain region. A lower portion of a first conductive structure is formed in the opening. A dielectric spacer is formed on the lower portion of the first conductive structure and formed on an inner wall of the opening. An upper portion of the first conductive structure is formed in the opening and formed on the lower portion of the first conductive structure. The dielectric spacer surrounds the upper portion of the first conductive structure.

According to an embodiment of the present invention, a semiconductor device is provided. The semiconductor device includes a semiconductor substrate, gate structures, a source/drain region, a dielectric layer, an opening, a first conductive structure, a conductive barrier layer, and a dielectric spacer. The gate structures are disposed on the semiconductor substrate. The source/drain region is disposed in the semiconductor substrate and disposed between the gate structures. The dielectric layer is disposed on the source/drain region and located between the gate structures. The opening penetrates the dielectric layer on the source/drain region. The first conductive structure is disposed in the opening. The first conductive structure includes a lower portion and an upper portion disposed on the lower portion. The conductive barrier layer is disposed in the opening and surrounds the first conductive structure. The dielectric spacer is disposed on the lower portion of the first conductive structure and surrounds the upper portion of the first conductive structure. The dielectric spacer is disposed between the conductive barrier layer and the upper portion of the first conductive structure.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-5 are schematic drawings illustrating a manufacturing method of a semiconductor device according to a first embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, and FIG. 5 is a schematic drawing in a step subsequent to FIG. 4.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Additionally, terms, such as "bottom", "below", "above", "top", and the like, may be used herein for ease of description to describe one element or feature's relationship to another element(s) or feature(s) as illustrated in the figures. If the device in the figures in turned over, elements described as "above" can become "below". It will be understood that spatially relative terms are intended to encompass different orientations of the device in use or operation in addition to the orientations depicted in the figures The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
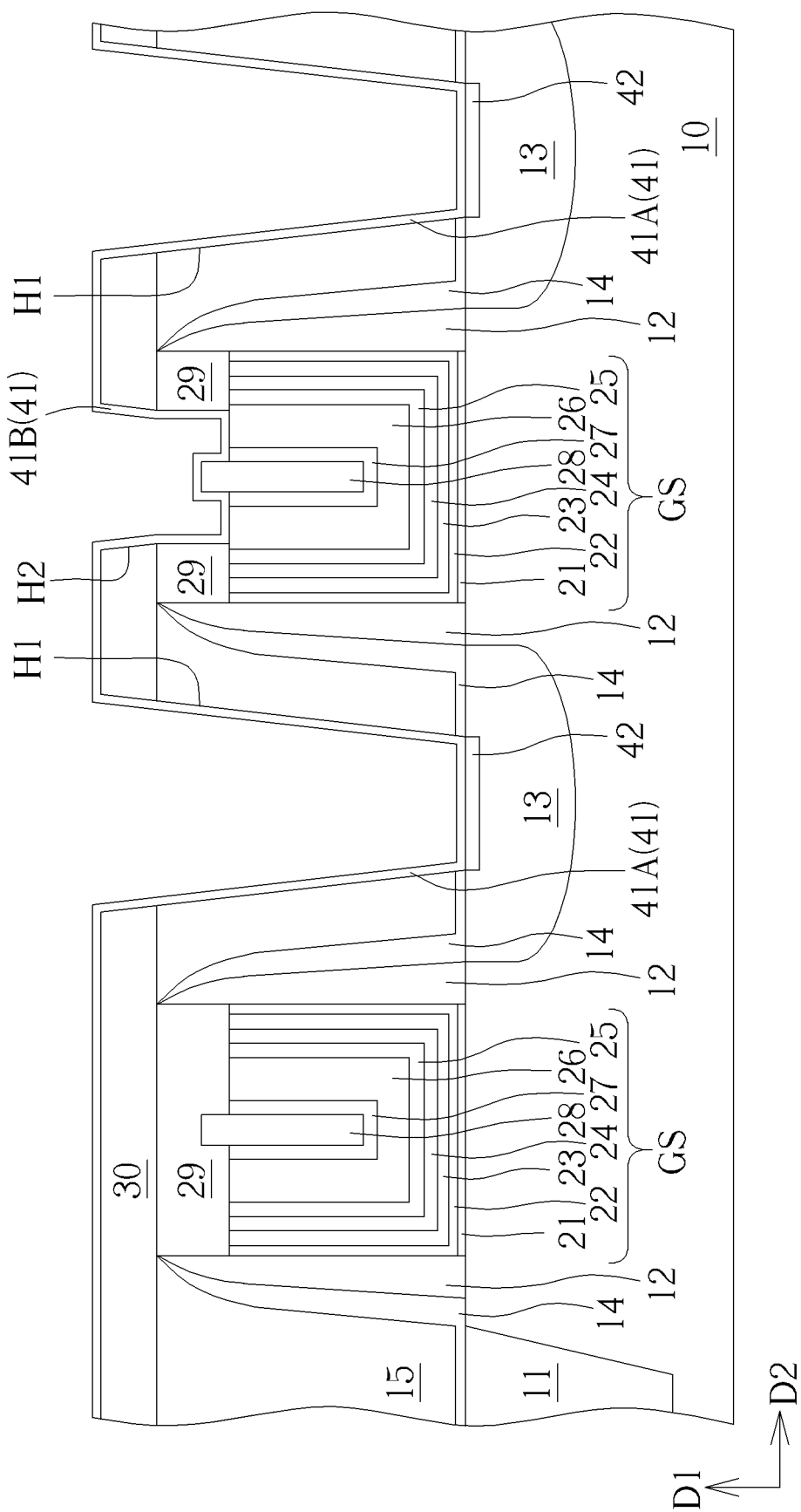
Figure 2:
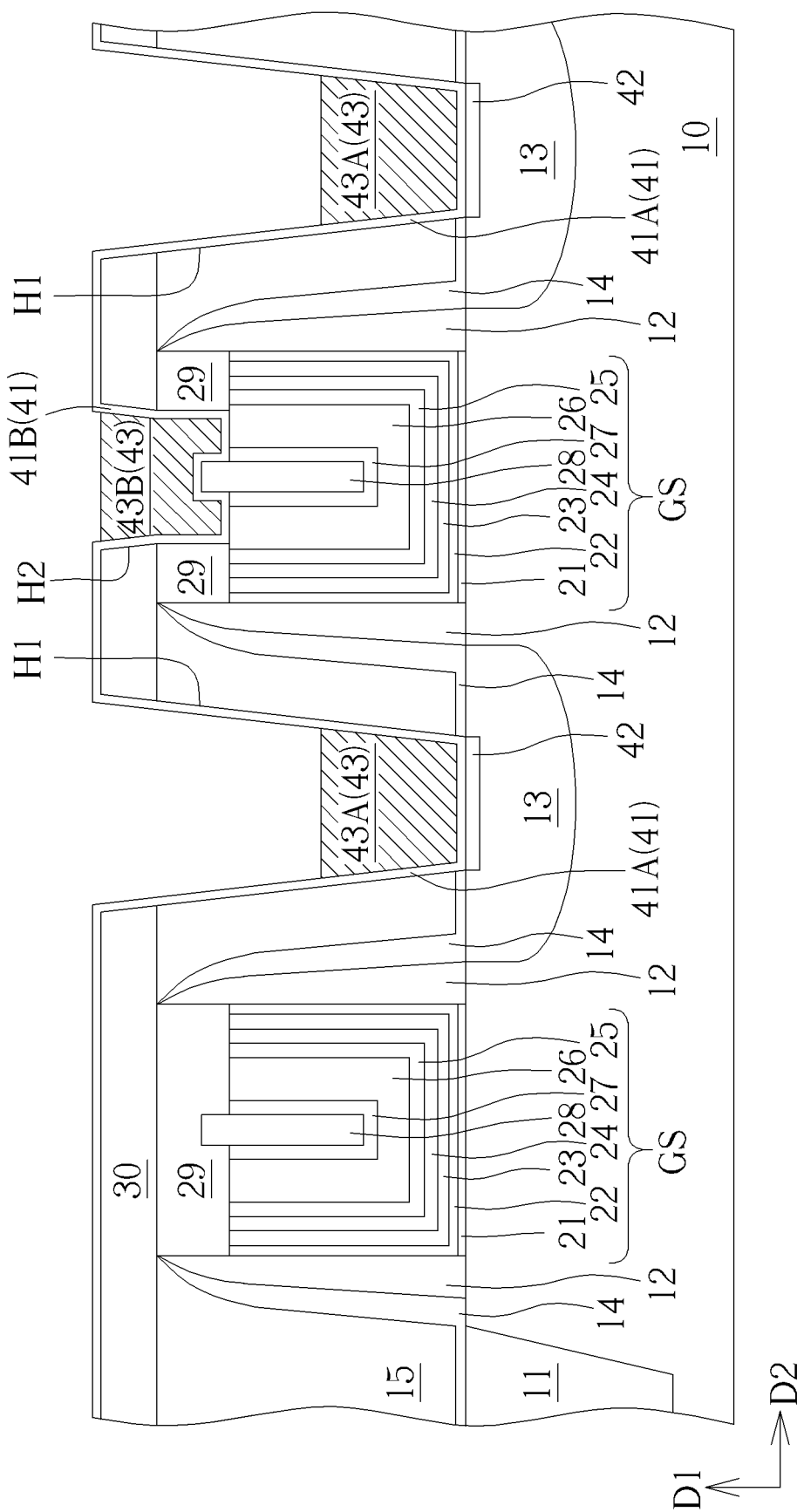
Figure 3:
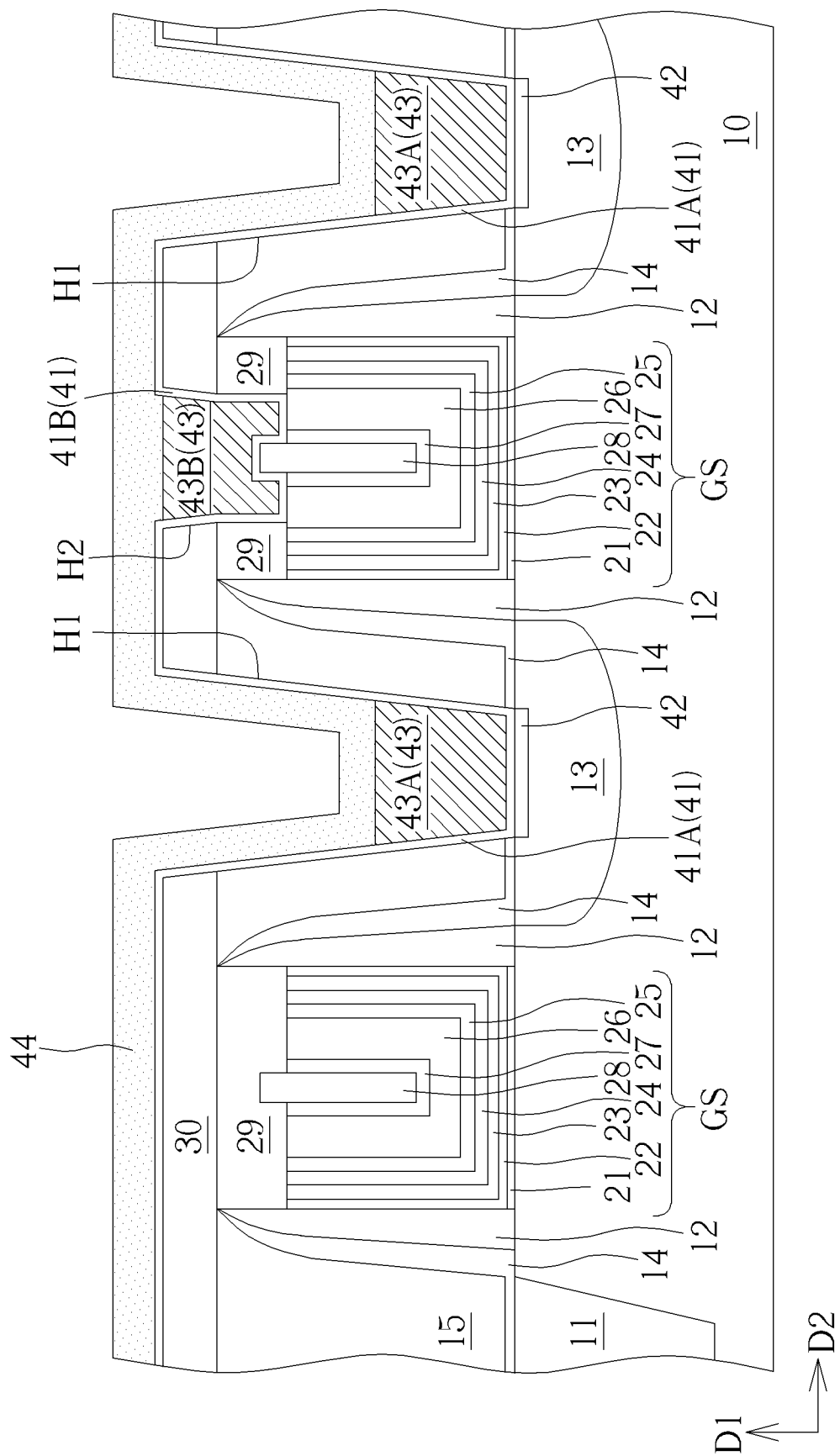
Figure 4:
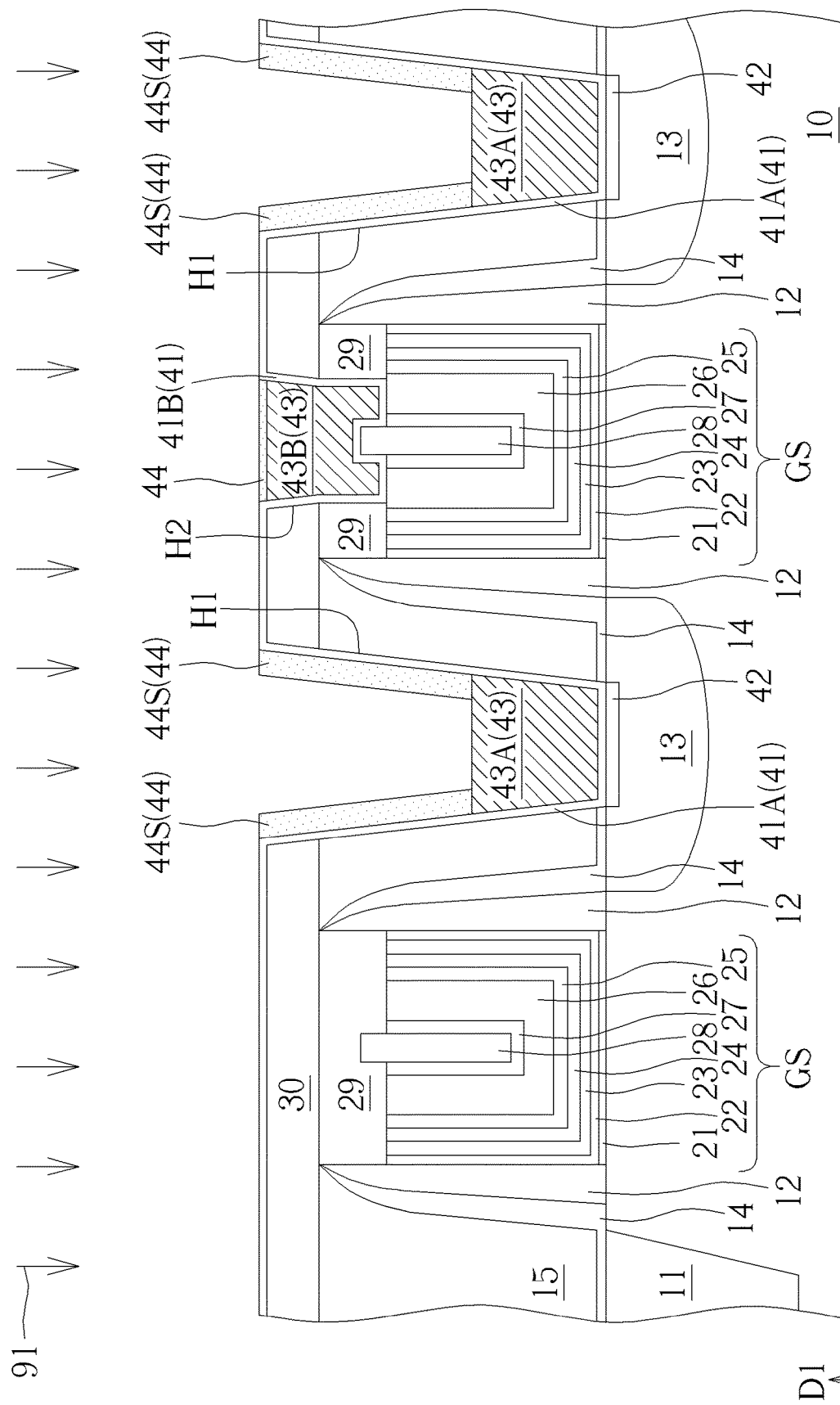
Figure 5:
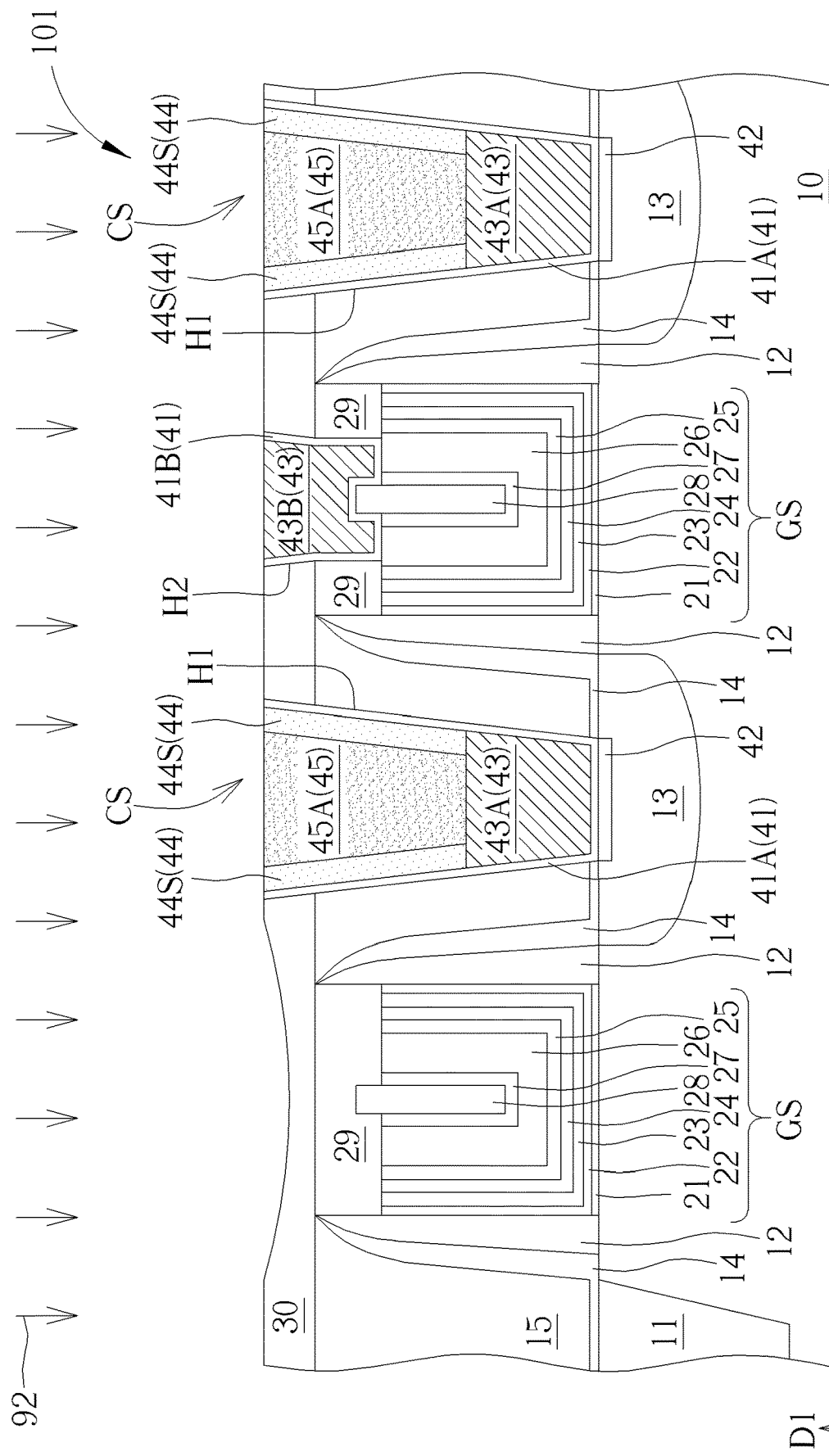

Please refer to FIGS. 1-5. FIGS. 1-5 are schematic drawings illustrating a manufacturing method of a semiconductor device according to a first embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, and FIG. 5 is a schematic drawing in a step subsequent to FIG. 4. As shown in FIG. 5, a manufacturing method of a semiconductor device 101 is provided in this embodiment. The manufacturing method includes the following steps. Firstly, a semiconductor substrate 10 is provided. Gate structures GS are formed on the semiconductor substrate 10. A source/drain region 13 is formed in the semiconductor substrate 10 and formed between the gate structures GS. A dielectric layer 15 is formed on the source/drain region 13 and located between the gate structures GS. Subsequently, an opening (such as a first opening H1 shown in FIG. 5) is formed penetrating the dielectric layer 15 on the source/drain region 13. A lower portion 43A of a first conductive structure CS is formed in the first opening H1. A dielectric spacer 44S is formed on the lower portion 43A of the first conductive structure CS and formed on an inner wall of the first opening H1. An upper portion 45A of the first conductive structure CS is formed in the first opening H1 and formed on the lower portion 43A of the first conductive structure CS. The dielectric spacer 44S surrounds the upper portion 45A of the first conductive structure CS.

Specifically, the manufacturing method of the semiconductor device 101 in this embodiment may include but is not limited to the following steps. As shown in FIG. 1, in some embodiments, the semiconductor substrate 10 may include a silicon substrate, an epitaxial silicon substrate, a silicon germanium substrate, silicon carbide substrate, or a silicon-on-insulator (SOI) substrate, but not limited thereto. In some embodiments, the semiconductor substrate 10 may include a fin structure according to some considerations, and the gate structures GS may be disposed on the fin structure of the semiconductor substrate 10, but not limited thereto. In addition, a shallow trench isolation 11 may be formed in the semiconductor substrate 10 for isolating the fin structures from one another. The shallow trench isolation 11 may include one layer or multiple layers of insulation materials, such as silicon nitride, silicon oxynitride, silicon carbonitride, or other suitable insulation materials. In some embodiments, each of the gate structures GS may include an interfacial layer 21, a gate dielectric layer 22, a barrier layer 23, an single layer or multiple layers of work function layer (such as a first work function layer 24, a second work function layer 25, a third work function layer 26 and/or a fourth work function layer 27 shown in FIG. 1), and a gate electrode 28. A gate capping layer 29 may be formed on the gate structures GS, and a gate sidewall spacer 12 may be formed on the sidewall of each of the gate structures GS and the sidewall of the gate capping layer 29, but not limited thereto.

The interfacial layer 21 may include silicon oxide or other suitable dielectric materials. The gate dielectric layer 22 may include a high dielectric constant (high-k) dielectric layer, such as hafnium oxide ($HfO_2$), hafnium silicon oxide ($HfSiO_4$), hafnium silicon oxynitride (HfSiON), aluminum oxide ($Al_2O_3$), tantalum oxide ($Ta_2O_5$), zirconium oxide ($ZrO_2$), or other suitable high-k materials. The first work function layer 24, the second work function layer 25, the third work function layer 26, and the fourth work function layer 27 may respectively include tantalum nitride (TaN), titanium nitride (TiN), titanium carbide (TiC), titanium aluminide (TiAl), titanium aluminum carbide (TiAlC), or other suitable N type and/or P type work function materials. The gate electrode 28 may include a low electrical resistivity metallic material, such as aluminum (Al), tungsten (W), copper (Cu), titanium aluminide, or other suitable low electrical resistivity metallic materials. The gate capping layer 29 and the gate sidewall spacer 12 may respectively include silicon nitride, silicon carbonitride, or other suitable insulation materials, and the gate sidewall spacer 12 may be a single layer structure or multiple layer structure composed of insulation materials.

In some embodiments, the gate structures GS may be formed by a replacement metal gate (RMG) process, and the gate structures GS may be formed in trenches formed by the dielectric layer 15 and the gate sidewall spacer 12, but not limited thereto. In addition, the source/drain region 13 may be formed in the semiconductor substrate 10 after the step of forming the gate sidewall spacer 12. The source/drain region 13 may include an epitaxial structure, a doped region, or other appropriate types of source/drain structures. In some embodiments, a contact etching stop layer (CESL) 14 may be formed conformally on the gate sidewall spacer 12 and the source/drain region 13 after the step of forming the source/drain region 13 and before the step of forming the dielectric layer 15, but not limited thereto. The material of the dielectric layer 15 may include silicon oxide or other suitable insulation materials, and the material of the contact etching stop layer 14 may include silicon nitride or other suitable insulation materials. In some embodiments, the gate structures GS and the gate capping layer 29 may be formed after the steps of forming the gate sidewall spacer 12, the contact etching stop layer 14, and the dielectric layer 15, but not limited thereto. Subsequently, a cover layer 30 may be formed covering the gate structures GS, the gate capping layer 29, and the dielectric layer 15, and the first opening H1 described above may be formed after the step of forming the cover layer 30. The cover layer 30 may include tetraethoxysilane (TEOS) or other suitable insulation materials. In some embodiments, the first opening H1 may penetrate the cover layer 30, the dielectric layer 15, and the contact etching stop layer 14 located above the source/drain region 13 for exposing a part of the source/drain region 13. Additionally, in some embodiments, a second opening H2 may be formed penetrating the cover layer 30 and the gate capping layer 29 above the gate structure GS for exposing a part of the gate structure GS, but not limited thereto.

In some embodiments, a conductive barrier layer 41 may be formed conformally on the cover layer 30 and formed conformally in the first opening H1 and the second opening H2 after the steps of forming the first opening H1 and the second opening H2. A part of the conductive barrier layer 41 may be formed conformally on the bottom of the first opening H1 and the inner wall of the first opening H1, and another port of the conductive barrier layer 41 may be formed conformally on the bottom of the second opening H2 and the inner wall of the second opening H2. The conductive barrier layer 41 in the first opening H1 may be regarded as a first portion 41A of the conductive barrier layer 41, and the conductive barrier layer 41 in the second opening H2 may be regarded as a second portion 41B of the conductive barrier layer 41. In some embodiments, the conductive barrier layer 41 may include titanium, titanium nitride, or a single layer structure or a multiple layer structure composed of other suitable metallic conductive materials. Additionally, in some embodiments, a silicide layer 42 may be formed between the conductive barrier layer 41 and the source/drain region 13 by a thermal process, and the silicide layer 42 may include titanium silicide or other suitable metal silicide for reducing the contact resistance between the source/drain region 13 and the lower portion of the first conductive structure, but not limited thereto.

Subsequently, as shown in FIG. 2, the lower portion 43A of the first conductive structure is formed in the first opening H1. In other words, the conductive barrier layer 41 may be formed before the step of forming the lower portion 43A of the first conductive structure. In some embodiments, the lower portion 43A of the first conductive structure may be formed by filling the first opening H1 with a first conductive material 43 and performing an etching process to the first conductive material 43. The first conductive material 43 may be formed by a chemical vapor deposition process or other suitable deposition processes, and the first conductive material 43 may include materials having relatively lower electrical resistivity, such as copper, aluminum, and tungsten, but not limited thereto. In some embodiments, the lower portion 43A of the first conductive structure may be formed by other processes according to some considerations. In addition, the topmost surface of the lower portion 43A of the first conductive structure may be lower than the top surface of the gate capping layer 29 and the top surface of the gate structure GS in a thickness direction of the semiconductor substrate 10 (such as a first direction D1 shown in FIG. 2), but not limited thereto.

In some embodiments, the second opening H2 may be filled with a part of the first conductive material 43 for forming a second conductive structure 43B on the gate structure GS, and the second conductive structure 43B is electrically connected with the corresponding gate structure GS. In other words, the second conductive structure 43B and the lower portion 43A of the first conductive structure may be formed concurrently, but not limited thereto. In some embodiments, some of the gate structures GS may be a dummy gate structure (such as the gate structure at the left side of FIG. 2), and there is no need to form the second opening H2 and the second conductive structure 43B on the dummy gate structures. Additionally, in some embodiments, a mask (not shown) may be formed covering the second conductive structure 43B during an etching back process performed to the lower portion 43A of the first conductive structure and configured to adjusting the height of the lower portion 43A, but not limited thereto. Therefore, a top surface (such as the topmost surface) of the lower portion 43A of the first conductive structure may be lower than a top surface (such as the topmost surface) of the second conductive structure 43B in the first direction D1.

As shown in FIG. 3 and FIG. 4, the dielectric spacer 44S is then formed on the lower portion 43A of the first conductive structure and on the inner wall of the first opening H1. The method of forming the dielectric spacer 44S may include but is not limited to the following steps. A spacer material layer 44 may be formed conformally on the lower portion 43A of the first conductive structure and on the inner wall of the first opening H1 first, and an etching process 91 may be performed to the spacer material layer 44 subsequently for removing a part of the spacer material layer 44 on the lower portion 43A of the first conductive structure and forming the dielectric spacer 44S. In other words, a part of the spacer material layer 44 on the lower portion 43A of the first conductive structure is removed for exposing a part of the lower portion 43A of the first conductive structure. In some embodiments, the spacer material layer 44 may include silicon nitride or other suitable dielectric materials, and the spacer material layer 44 may be formed by atomic layer deposition (ALD) process or other suitable film forming processes.

As shown in FIG. 5, the upper portion 45A of the first conductive structure CS is then formed in the first opening H1 and formed on the lower portion 43A of the first conductive structure CS. In other words, the dielectric spacer 44S may be formed after the step of forming the second conductive structure 43B and before the step of forming the upper portion 45A of the first conductive structure CS. The upper portion 45A of the first conductive structure CS may directly contact and be connected with the lower portion 43A of the first conductive structure CS, and the first conductive structure CS may be electrically connected with the corresponding source/drain region 13. In addition, the dielectric spacer 44S may surround the upper portion 45A of the first conductive structure CS in the first opening H1, and the conductive barrier layer 41 may surround the dielectric spacer 44S and the first conductive structure CS in the first opening H1. The method of forming the upper portion 45 of the first conductive structure CS may include but is not limited to the following steps. Firstly, a second conductive material 45 may be formed on the cover layer 30 and formed in the first opening H1, and the first opening H1 may be filled with the second conductive material 45, the dielectric spacer 44S, the lower portion 43A of the first conductive structure CS, and the conductive barrier layer 41. Subsequently, a planarization process 92 may be performed for removing the second conductive material 45 outside the first opening H1 and forming the upper portion 45A of the first conductive structure CS. In addition, the planarization process 92 may include a chemical mechanical polishing (CMP) process or other suitable planarization approaches. In some embodiments, a part of the cover layer 30 and/or a part of the spacer material layer 44 formed on the second conductive structure 43B may be removed concurrently by the planarization process 92, and a dishing may be formed on the top surface of the cover layer 30 accordingly, but not limited thereto.

The second conductive material 45 may include materials having relatively lower electrical resistivity, such as copper, aluminum, and tungsten, and the formation of the second conductive material 45 may include a chemical vapor deposition process or other suitable deposition processes, but not limited thereto. In some embodiments, the composition of the first conductive material 43 may be identical to the composition of the second conductive material 45, and the material composition of the upper portion 45A of the first conductive structure CS may be identical to the material composition of the lower portion 43A of the first conductive structure CS accordingly, but not limited thereto. In some embodiments, the lower portion 43A and the upper portion 45A of the first conductive structure CS may also be formed by different conductive materials respectively according to some considerations. In addition, the electrical resistivity of the first conductive material 43 and the electrical resistivity of the second conductive material 45 may be lower than the electrical resistivity of the conductive barrier layer 41, and the conductive barrier layer 41 may be formed by a conductive material having better barrier performance, but not limited thereto.

The semiconductor device 101 shown in FIG. 5 may be formed by the manufacturing method described above. The semiconductor device 101 may include the semiconductor substrate 10, the gate structures GS, the source/drain region 13, the dielectric layer 15, the first opening H1, the first conductive structure CS, the conductive barrier layer 41, and the dielectric spacer 44S. The gate structures GS are disposed on the semiconductor substrate 10. The source/drain region 13 is disposed in the semiconductor substrate 10 and disposed between the gate structures GS. The dielectric layer 15 is disposed on the source/drain region 13 and located between the gate structures GS. The first opening H1 penetrates the dielectric layer 15 on the source/drain region 13. The first conductive structure CS is disposed in the first opening H1. The first conductive structure CS includes the lower portion 43A and the upper portion 45A disposed on the lower portion 43A. The conductive barrier layer 41 is disposed in the first opening H1 and surrounds the first conductive structure CS. The dielectric spacer 44S is disposed on the lower portion 43A of the first conductive structure CS and surrounds the upper portion 45A of the first conductive structure CS. The dielectric spacer 44S is disposed between the conductive barrier layer 41 and the upper portion 45A of the first conductive structure CS.

In some embodiments, the dielectric spacer 44S may be located between the upper portion 45A of the first conductive structure CS and the conductive barrier layer 41 in a direction from a center of the first opening H1 toward one of the gate structures GS (such as a second direction D2 shown in FIG. 5 and a direction opposite to the second direction D2). The dielectric spacer 44S may surround the upper portion 45A of the first conductive structure CS in the first opening H1, and the conductive barrier layer 41 may surround the dielectric spacer 44S, the upper portion 45A of the first conductive structure CS, and the lower portion 43A of the first conductive structure CS in the first opening H1. In some embodiments, the topmost surface of the conductive barrier layer 41, the topmost surface of the dielectric spacer 44S, the topmost surface of the upper portion 45A of the first conductive structure CS, the topmost surface of the second conductive structure 43B, and the topmost surface of the cover layer 30 may be substantially coplanar with one another, but not limited thereto. Additionally, in the first opening H1, the bottom surface of the conductive barrier layer 41, the bottom surface of the upper portion 45A of the first conductive structure CS, and the top surface of the lower portion 43A of the first conductive structure CS may be substantially coplanar with one another, and the top surface of the lower portion 43A of the first conductive structure CS may be lower than the top surface of the gate capping layer 29 and the top surface of the gate structure GS in the first direction D1, but not limited thereto.

In some embodiments, the semiconductor device 101 may further include the silicide layer 42 disposed between the source/drain region 13 and the conductive barrier layer 41, but not limited thereto. In some embodiments, the semiconductor device 101 may further include the second conductive structure 43B disposed on one of the gate structures GS and electrically connected with the gate structure GS. In some embodiments, the top surface of the lower portion 43A of the first conductive structure CS may be lower than the top surface of the second conductive structure 43B in the thickness direction of the semiconductor substrate 10 (i.e. the first direction D1). In some embodiments, the semiconductor device 101 may further include the gate sidewall spacer 12, the contact etching stop layer 14, and the cover layer 30. The gate sidewall spacer 12 may be disposed on the sidewall of the gate structure GS and the sidewall of the gate capping layer 29. The contact etching stop layer 14 may be partly disposed between the dielectric layer 15 and the gate sidewall spacer 12 and partly disposed between the dielectric layer 15 and the source/drain region 13. The cover layer 30 may be disposed on the gate capping layer 29 and the dielectric layer 15. The first conductive structure CS may be disposed in the first opening H1 penetrating the cover layer 30, the dielectric layer 15, and the contact etching stop layer 14, and the second conductive structure 43B may be disposed in the second opening H2 penetrating the cover layer 30 and the gate capping layer 29. In addition, the conductive barrier layer 41 may include the first portion 41A disposed in the first opening H1 and surrounding the first conductive structure CS, and the conductive barrier layer 41 may include the second portion 41B disposed in the second opening H2 and surrounding the second conductive structure 43B, but not limited thereto. The distance between the first conductive structure CS and the second conductive structure 43B (such as a distance in the second direction D2) may be enlarged and the isolation between the first conductive structure CS and the second conductive structure 43B may be improved by forming the first conductive structure CS in the first opening H1 by separated approaches and forming the dielectric spacer 44S on the lower portion 43A of the first conductive structure CS and surrounding the upper portion 45A of the first conductive structure CS. Accordingly, the electrical performance and the reliability of the semiconductor device 101 may be improved. For example, the time dependent dielectric breakdown (TDDB) of the semiconductor device 101 may be improved, but not limited thereto.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 6:
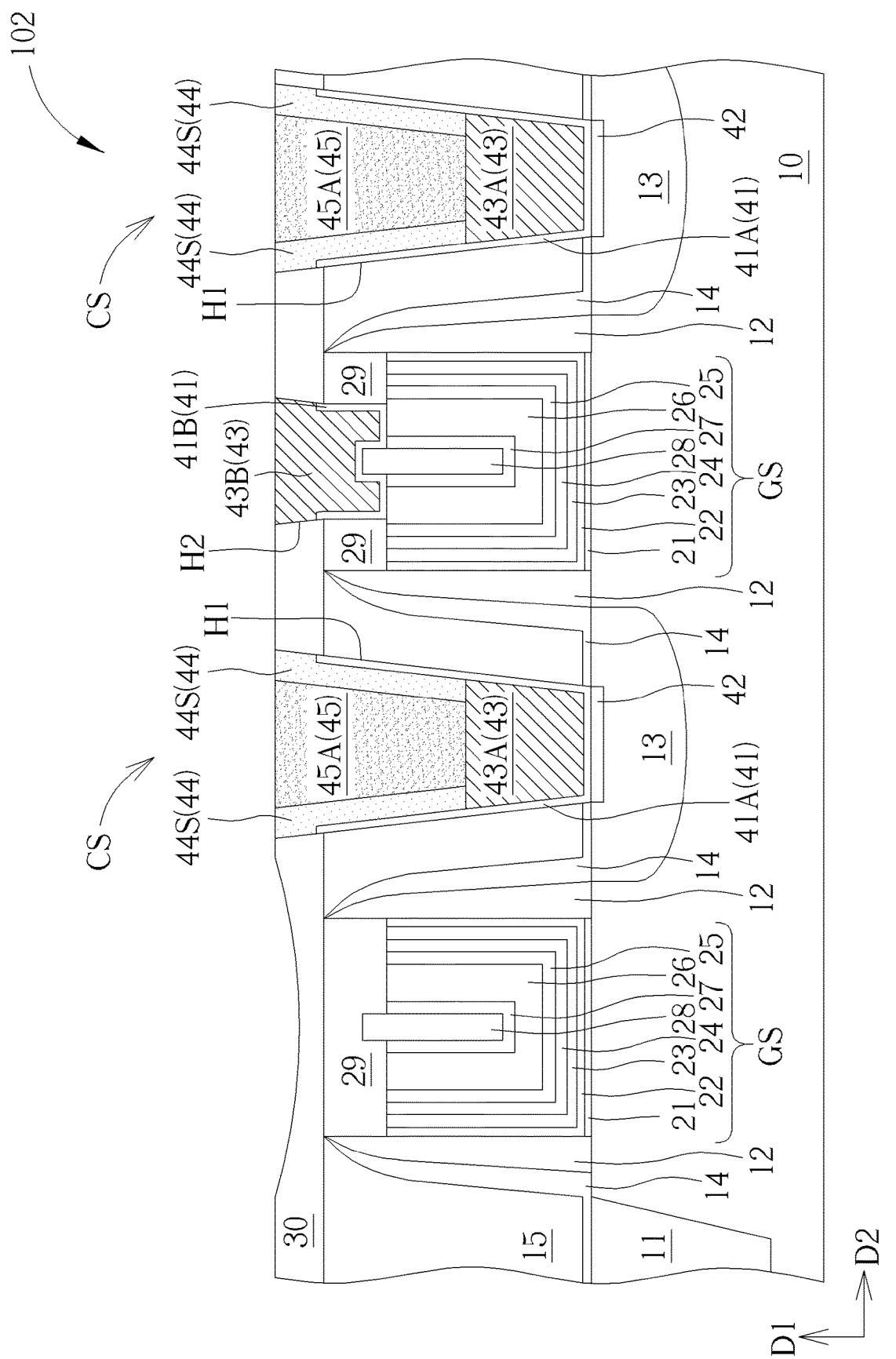
FIG. 6 is a schematic drawing illustrating a semiconductor device according to a second embodiment of the present invention.

Please refer to FIG. 6. FIG. 6 is a schematic drawing illustrating a semiconductor device 102 according to a second embodiment of the present invention. As shown in FIG. 6, the difference between the semiconductor device 102 and the semiconductor device in the first embodiment described above is that the topmost surface of the conductive barrier layer 41 in the first direction D1 may be lower than the topmost surface of the topmost surface of the covering layer 30 in the semiconductor device 102. In some embodiments, the dielectric spacer 44S may cover the top surface of the conductive barrier layer 41 (such as the topmost surface of the first portion 41A of the conductive barrier layer 41) in the thickness direction of the semiconductor substrate 10 (i.e. the first direction D1). Additionally, in the first opening H1, the top surface of the conductive barrier layer 41 may be lower than the top surface of the upper portion 45A of the first conductive structure CS in the first direction D1. In some embodiments, an etching process (such as the etching process for forming the lower portion 43A of the first conductive structure CS, but not limited thereto) may be performed to the conductive barrier layer 41 before the step of forming the spacer material layer 44, and the topmost surface of the conductive barrier layer 41 may then be lower than the topmost surface of the cover layer 30. Additionally, in some embodiments, the topmost surface of the conductive barrier layer 41 in the second opening H2 may be lower than the topmost surface of the cover layer 30 and the topmost surface of the second conductive structure 43B in the first direction D1, and the second conductive structure 43B may cover the topmost surface of the second portion 41B of the conductive barrier layer 41 in the first direction D1, but not limited thereto.

To summarize the above descriptions, in the semiconductor device and the manufacturing method thereof according to the present invention, the lower portion and the upper portion of the first conductive structure may be formed in the first opening by separated approaches for forming the dielectric spacer on the lower portion of the first conductive structure and surrounding the upper portion of the first conductive structure. The distance between the first conductive structure disposed corresponding to the source/drain region and the second conductive structure disposed corresponding to the gate structure may be enlarged and the isolation between the first conductive structure and the second conductive structure may be improved by disposing the dielectric spacer. The electrical performance and/or the reliability of the semiconductor device may be improved accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a semiconductor device, comprising:

providing a semiconductor substrate, wherein gate structures are formed on the semiconductor substrate, a source/drain region is formed in the semiconductor substrate and formed between the gate structures, and a dielectric layer is formed on the source/drain region and located between the gate structures forming an opening penetrating the dielectric layer on the source/drain region;

forming a lower portion of a first conductive structure in the opening;

forming a dielectric spacer on the lower portion of the first conductive structure and on an inner wall of the opening; and forming an upper portion of the first conductive structure in the opening and on the lower portion of the first conductive structure, wherein the dielectric spacer surrounds the upper portion of the first conductive structure, and the step of forming the dielectric spacer comprises:

forming a spacer material layer conformally on the lower portion of the first conductive structure and the inner wall of the opening; and performing an etching process to the spacer material layer for removing a part of the spacer material layer on the lower portion of the first conductive structure and forming the dielectric spacer.

2. The manufacturing method of the semiconductor device according to claim 1, wherein a material composition of the upper portion of the first conductive structure is identical to a material composition of the lower portion of the first conductive structure.

3. The manufacturing method of the semiconductor device according to claim 1, further comprising:

forming a conductive barrier layer conformally on a bottom of the opening and the inner wall of the opening before forming the lower portion of the first conductive structure.

4. The manufacturing method of the semiconductor device according to claim 3, wherein the conductive barrier layer surrounds the dielectric spacer and the first conductive structure in the opening.

5. The manufacturing method of the semiconductor device according to claim 3, wherein the dielectric spacer is located between the upper portion of the first conductive structure and the conductive barrier layer in a direction from a center of the opening toward one of the gate structures.

6. The manufacturing method of the semiconductor device according to claim 3, further comprising:

forming a silicide layer between the source/drain region and the conductive barrier layer.

7. The manufacturing method of the semiconductor device according to claim 1, further comprising:

forming a second conductive structure on one of the gate structures, the second conductive structure electrically connected with the gate structure, wherein the second conductive structure and the lower portion of the first conductive structure are formed concurrently, and a top surface of the lower portion of the first conductive structure is lower than a top surface of the second conductive structure in a thickness direction of the semiconductor substrate.

8. The manufacturing method of the semiconductor device according to claim 7, wherein the dielectric spacer is formed after the step of forming the second conductive structure and before the step of forming the upper portion of the first conductive structure.

9. The manufacturing method of the semiconductor device according to claim 1, wherein the first conductive structure is electrically connected with the source/drain region.

* * * * *